United States Patent
Dias et al.

(10) Patent No.: US 10,142,040 B2
(45) Date of Patent: Nov. 27, 2018

(54) APPARATUS FOR REDUCING AN AMPLITUDE IMBALANCE AND A PHASE IMBALANCE BETWEEN AN IN-PHASE SIGNAL AND A QUADRATURE SIGNAL

(71) Applicant: Intel IP Corporation, Santa Clara, CA (US)

(72) Inventors: Victor Da Fonte Dias, Neubiberg (DE); Giuseppe Li Puma, Bochum (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/349,008

(22) Filed: Nov. 11, 2016

(65) Prior Publication Data
US 2017/0170915 A1 Jun. 15, 2017

(30) Foreign Application Priority Data
Dec. 14, 2015 (EP) .................... 15199907

(51) Int. Cl.
*H04B 17/21* (2015.01)
*H04B 1/00* (2006.01)
(Continued)

(52) U.S. Cl.
CPC ............. *H04B 17/21* (2015.01); *H03D 3/009* (2013.01); *H04B 1/0042* (2013.01); *H04B 1/16* (2013.01);
(Continued)

(58) Field of Classification Search
USPC .............. 375/316, 324, 227, 322; 455/115.2, 455/226.1, 142
See application file for complete search history.

(56) References Cited

U.S. PATENT DOCUMENTS

2006/0291549 A1* 12/2006 Seppinen ............... H04B 17/21
375/227
2014/0002287 A1* 1/2014 Klepser ............... H04L 27/2003
341/144

* cited by examiner

*Primary Examiner* — Wednel Cadeau
(74) *Attorney, Agent, or Firm* — Eschweiler & Potashnik, LLC

(57) ABSTRACT

An apparatus for reducing an amplitude imbalance and a phase imbalance between an in-phase signal and a quadrature signal is provided. The in-phase signal and the quadrature signal are based on a radio frequency receive signal. The apparatus includes an imbalance estimation module configured to generate a first correction signal related to a first phase shift, and to generate a second correction signal related to a second phase shift. Further, the apparatus includes a first digital-to-time converter configured to receive the first correction signal and a local oscillator signal. The first digital-to-time converter is further configured to supply a first replica of the local oscillator signal for a first mixer generating the in-phase signal, wherein the first replica of the local oscillator signal has the first phase shift with respect to the local oscillator signal. The apparatus further includes a second digital-to-time converter configured to receive the second correction signal and the local oscillator signal. The second digital-to-time converter is further configured to supply a second replica of the local oscillator signal for a second mixer generating the quadrature signal, wherein the second replica of the local oscillator signal has the second phase shift with respect to the local oscillator signal.

15 Claims, 2 Drawing Sheets

(51) Int. Cl.
- *H04B 1/16* (2006.01)
- *H03D 3/00* (2006.01)
- *H04B 1/30* (2006.01)
- *H04L 27/38* (2006.01)
- *H04L 27/00* (2006.01)

(52) U.S. Cl.
CPC ........... *H04B 1/30* (2013.01); *H04L 27/3863* (2013.01); *H04L 2027/0067* (2013.01)

APPARATUS FOR REDUCING AN AMPLITUDE IMBALANCE AND A PHASE IMBALANCE BETWEEN AN IN-PHASE SIGNAL AND A QUADRATURE SIGNAL

CROSS REFERENCE TO RELATED APPLICATIONS

This application claims priority to European Application No. 15199907.5, filed on Dec. 14, 2015, which is hereby incorporated herein by reference in its entirety.

FIELD

Examples relate to imbalance correction within a radio frequency (RF) receiver. In particular, examples relate to an apparatus for reducing an amplitude imbalance and a phase imbalance between an in-phase (I) signal and a quadrature (Q) signal.

BACKGROUND

Imbalances (e.g. an amplitude or a phase imbalance) between an I signal and a Q signal in a receiver affect the receiver's performance. For example, a Signal-to-Interference ratio or a maximum transmission bit rate may be decreased. The imbalances are related to mismatches between the parallel paths of the receiver for the I signal and the Q signal. For example, phase imbalances may occur since the delay between the Local Oscillator (LO) signal for the I signal processing path and the delayed LO signal for the Q signal processing path is not exactly 90°. An amplitude imbalance may, e.g., be related to non-perfectly matched gains in the parallel signal processing paths. In a conventional receiver, imbalances between the I signal and the Q signal are estimated and corrected in the digital domain. In such a conventional receiver, the signals with the imbalanced amplitude and phase values are processed all along the I signal processing path and the Q signal processing path, respectively. For example, the unbalanced signals are processed in a mixer, a baseband filter, an Analog-to-Digital Converter (ADC) and digital filters of the respective signal processing path up to the imbalance estimation and correction. However, this may cause interference between paths, so that it may be difficult or almost impossible to adequately compensate the imbalances.

Hence, there may be a desire for an improved imbalance correction.

BRIEF DESCRIPTION OF THE DRAWINGS

Some examples of apparatuses and/or methods will be described in the following by way of example only, and with reference to the accompanying figures, in which.

DETAILED DESCRIPTION

Figure 1:
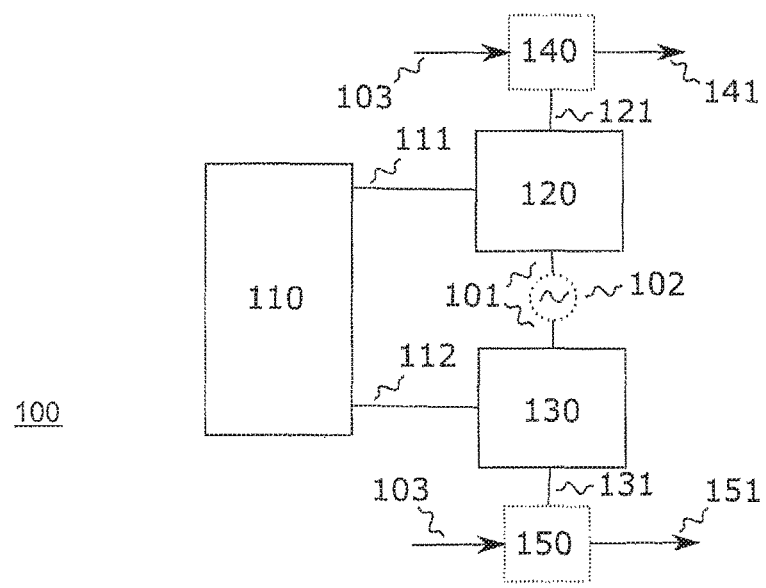
FIG. 1 illustrates an example of an apparatus for reducing an amplitude imbalance and a phase imbalance between an I signal and a Q signal.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent", to name just a few examples).

The terminology used herein is for the purpose of describing particular examples is not intended to be limiting for further examples. Whenever a singular form such as "a," "an" and "the" is used and using only a single element is neither explicitly or implicitly defined as being mandatory, further examples may also plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong, unless expressly defined otherwise herein.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In some examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 illustrates an apparatus 100 for reducing an amplitude imbalance and a phase imbalance between an I signal 141 and a Q signal 151. The I signal 141 is generated by a first mixer 140 from a RF receive signal 103. The Q signal 151 is generated by a second mixer 150 from the RF receive signal 103. That is, the I signal 141 and the Q signal 151 are based on the RF receive signal 103.

The apparatus 100 comprises an imbalance estimation module 110 generating a first correction signal 111 related to a first phase shift, and a second correction signal 112 related to a second phase shift. The imbalance estimation module 110 calculates the first phase shift and the second phase shift based on an estimation of the amplitude imbalance and/or an estimation of the phase imbalance. The imbalance estimation module 110 may be implemented digitally, i.e., the imbalance estimation module 110 may receive, process or output digital signals (e.g. the first correction signal 111 or the second correction signal 111).

A first digital-to-time converter (DTC) 120 of the apparatus 100 receives the first correction signal 111 at a first input and a local oscillator (LO) signal 101 of a LO 102 at a second input. For example, the LO 102 may be a Phase-Locked Loop (PLL). The first DTC 120 supplies a first replica of the LO signal 121 for the first mixer 140, which generates the I signal 141. The first replica of the LO signal 121 has the first phase shift with respect to the LO signal 101. In other words, the phase shift between the LO signal 101 and the first replica of the LO signal 121 is adjusted by the first DTC 120 on the basis of the first correction signal 111.

The apparatus 100 further comprises a second DTC 130 receiving the second correction signal 112 at a first input and the LO signal 101 at a second input. The second DTC 130 supplies a second replica of the LO signal 131 for the second mixer 150, which generates the Q signal 151. The second replica of the LO signal 131 has the second phase shift with respect to the LO signal 101. In other words, the phase shift between the LO signal 101 and the second replica of the LO signal 131 is adjusted by the second DTC 130 on the basis of the second correction signal 112.

Using the first DTC 120 and the second DTC 130 to provide the first and second replicas of the LO signal 121, 131 may allow to provide LO signals to the first and second mixers 140, 150 having a defined phase shift with respect to each other. The phase of the first and second replicas of the LO signal 121, 131 may be adjusted such that the amplitude imbalance and the phase imbalance between the I signal 141 and the Q signal 151 may be compensated or at least reduced.

This may become more evident from the following schematic example. Assuming an in-phase signal $I=\{I_l\}$ and a quadrature signal $Q=\{Q_l\}$ with $l=1, \ldots, L$, the amplitude imbalance k may be estimated according to $$k = \sqrt{\frac{\langle Q, Q \rangle}{\langle I, I \rangle}}, \qquad (1)$$

with $\langle x, y \rangle$ being defined as $$\langle x, y \rangle := \frac{1}{T} \int_0^T x(t)y(t)\,dt. \qquad (2)$$

The phase imbalance $\phi_e$ may be estimated as $$\Phi_e = \sin^{-1}\frac{\langle I, Q\rangle}{|I||Q|}. \quad (3)$$

Further assuming a discrete time implementation, the phase imbalance may be estimated as $$\sin(\Phi_e) = \frac{\sum_{l=1}^{L} I_l Q_l}{\sqrt{\sum_{l=1}^{L} I_l^2 \sum_{l=1}^{L} Q_l^2}} \approx \frac{\sum_{l=1}^{L} I_l Q_l}{2\left(\sum_{l=1}^{L} I_l^2 \sum_{l=1}^{L} Q_l^2\right)}, \quad (4)$$

and the amplitude imbalance may be estimated as $$k = \sqrt{\frac{\langle Q, Q\rangle}{\langle I, I\rangle}} \approx \sqrt{1 + 2\frac{\langle Q, Q\rangle - \langle I, I\rangle}{\langle Q, Q\rangle + \langle I, I\rangle}}, \quad (5)$$

which can be simplified as $$k \approx 1 + \frac{\sum_{l=1}^{L} Q_l^2 - \sum_{l=1}^{L} I_l^2}{\sum_{l=1}^{L} Q_l^2 + \sum_{l=1}^{L} I_l^2}. \quad (6)$$

Further consider a real in-phase signal I and a real, imbalanced quadrature signal $Q_e = kQ$, with $$k = \frac{Q}{I}$$

being the amplitude imbalance. These signals may be represented as a complex signal according to $$I + jQke^{j\Phi_e} \quad (7),$$

with $\phi_e$ denoting the phase imbalance.

By adjusting the phases of the first replica of the LO signal and the second replica of the LO signal, the imbalance may be compensated for. The complex signal of equation (7) may be represented as $$Ie^{j\Phi_1} + jQke^{j\Phi_e}e^{j\Phi_2} \quad (8),$$

with k denoting the amplitude imbalance and $\phi_e$ denoting the phase imbalance as defined above, $\phi_1$ denoting the first phase shift and $\phi_2$ denoting the second phase shift. In order to calculate the required phase shifts $\phi_1$ and $\phi_2$ for compensating the amplitude imbalance and the phase imbalance, equation (8) may be rewritten using $e^{jx} = \cos(x) + j\sin(x)$ as $$I\cos(\Phi_1) - Qk\sin(\Phi_x) + j(I\sin(\Phi_1) + Qk\cos(\Phi_x)) \quad (9),$$

with $\Phi_x = \Phi_e \Phi_2$. Equation (9) may be further rewritten as $$kI + jkQ \quad (10).$$

Equations (9) and (10) may be transferred to a system of linear equations:

$$kI = I\cos(\Phi_1) - Qk\sin(\Phi_x) \quad (11)$$

$$kQ = I\sin(\Phi_1) + Qk\cos(\Phi_x) \quad (12)$$

Assuming small angles (i.e. $\Phi_1$, $\Phi_2 \ll 1$ rad) and using the approximations $\sin(x) \approx x$ and $\cos(x) = 1-x$, the system of linear equations (11), (12) may be rewritten as:

$$kI = I(1-\Phi_1) - Qk\Phi_x \quad (13)$$

$$kQ = I\Phi_1 + Qk(1-\Phi_x) \quad (14)$$

Solving the system of linear equations (13), (14) for the two phase shifts yields:

$$\begin{bmatrix}\Phi_1 \\ \Phi_2\end{bmatrix} = \begin{bmatrix}\frac{1-k}{2} \\ \frac{I}{Q}\frac{1-k}{2k} - \Phi_e\end{bmatrix} \quad (15)$$

The parameters k and $\phi_e$ may be approximated according to equations (1) and (3), so that the two phase shifts $\phi_1$ and $\phi_2$ may be calculated. Accordingly, the first correction signal 111 for the first DTC 120 and the second correction signal 112 for the second DTC 130 may be generated, which contain information on the first phase shift $\phi_1$ and the second phase shift $\phi_2$, respectively. Based on the first and second correction signals 111, 112, the DTCs 120, 130 may adjust the phase of the LO signals provided to the first and second mixers 140, 150. As a result, an amplitude imbalance and a phase imbalance between the in-phase signal 141 and the quadrature signal 151 may be compensated or at least reduced.

In the above example, the amplitude imbalance was associated to the quadrature signal 151. In a similar way, the amplitude imbalance may be associated to the in-phase signal 141. This yields in the following system of linear equations:

$$I = Ik\cos(\Phi_1) - Q\sin(\Phi_x) \quad (16)$$

$$Q = Ik\sin(\Phi_1) + Q\cos(\Phi_x) \quad (17)$$

Using the same approximations as above, the system of linear equations (16), (17) may be rewritten as:

$$I = Ik(1-\Phi_1) - Q\Phi_x \quad (18)$$

$$Q = Ik\Phi_1 + Q(1-\Phi_x) \quad (19)$$

Solving the system of linear equations (18), (19) for the two phase shifts yields:

$$\begin{bmatrix}\Phi_1 \\ \Phi_2\end{bmatrix} = \begin{bmatrix}\frac{k-1}{2k} \\ \frac{I}{Q}\frac{k-1}{2k} - \Phi_e\end{bmatrix} \quad (20)$$

Regarding the above equations, it is evident that various different approximations may be used for calculating the first phase shift $\phi_1$ and the second phase shift $\phi_2$. In general, the imbalance estimation module 110 may calculate the first phase shift $\phi_1$ based on information related to the amplitude imbalance and/or information related to the phase imbalance. Further, the imbalance estimation module may generally calculate the second phase shift $\phi_2$ based on information related to the amplitude imbalance and/or information related to the phase imbalance.

FIG. 1 may be summarized in using DTCs for quadrature LO signal generation. With this concept, the I&Q gain and phase imbalance correction may be absorbed in the phase of the DTC signals mixing the RF signal down to the baseband.

Generally speaking, some examples of the proposed concept relate to a means for reducing an amplitude imbalance and a phase imbalance between an I signal and a Q signal, wherein the I signal and the Q signal are based on a RF receive signal. The means comprises a means for generating a first correction signal related to a first phase shift, and for generating a second correction signal related to a second phase shift. Further, it comprises a means for receiving the first correction signal and a LO signal, and for supplying a first replica of the LO signal for a first mixer generating the I signal, wherein the first replica of the LO signal has the first phase shift with respect to the LO signal. It further comprises a means for receiving the second correction signal and the LO signal, and for supplying a second replica of the LO signal for a second mixer generating the Q signal, wherein the second replica of the LO signal has the second phase shift with respect to the LO signal.

The means for reducing an amplitude imbalance and a phase imbalance may be implemented by an apparatus for reducing an amplitude imbalance and a phase imbalance described above or below (e.g. FIG. 1). The means for generating a first correction signal and for generating a second correction signal may be implemented by an imbalance estimation module described above or below (e.g. FIG. 1). The means for receiving the first correction signal and the LO signal, and for supplying the first replica of the LO signal may be implemented by a first DTC described above or below (e.g. FIG. 1). The means for receiving the second correction signal and the LO signal, and for supplying the second replica of the LO signal may be implemented by a second DTC described above or below (e.g. FIG. 1).

Figure 2:
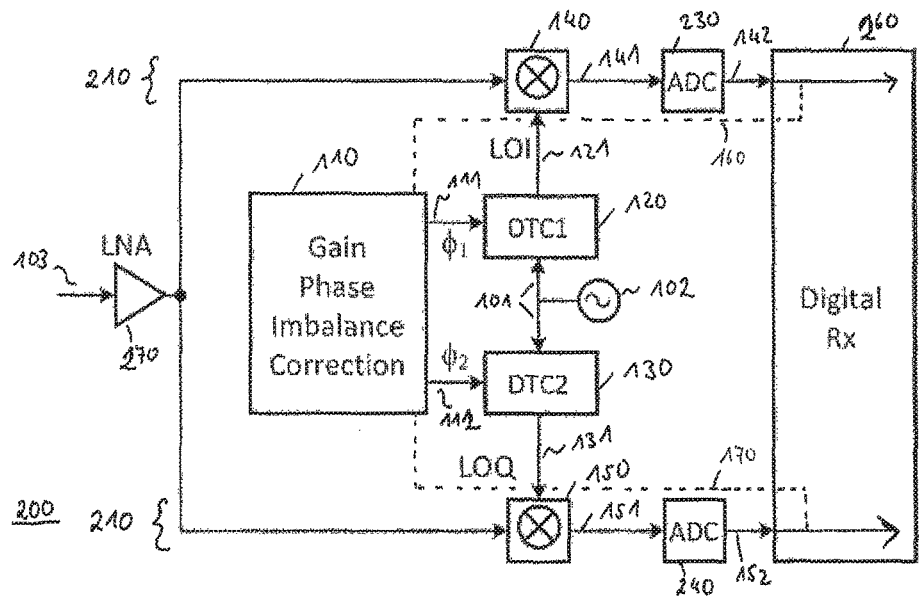
FIG. 2 illustrates an example of a receiver comprising an apparatus for reducing an amplitude imbalance and a phase imbalance between an I signal and a Q signal.

In FIG. 2, a receiver 200 using the proposed concept is illustrated. A RF receive signal 103 is provided to a Low Noise Amplifier (LNA) 270 by e.g. an antenna element (not illustrated). The LNA 270 may amplify a possibly weak RF receive signal 103 while adding as little noise and distortion as possible to the signal.

The receiver 200 comprises a first signal processing path 210, which comprises the first mixer 140. Further, the receiver 200 comprises a second signal processing path 220, which comprises the second mixer 150. Both signal processing paths 210, 220 are coupled to LNA 270.

The imbalance estimation module 110 generates the first correction signal 111 related to the first phase shift $\phi_1$, and the second correction signal 112 related to the second phase shift $\phi_2$.

The first correction signal 111 is received by the first DTC 120 together with the LO signal 101 provided by the LO 102. The first DTC 120 is controlled by the first correction signal 111 in order to output the first replica of the LO signal 121 having the first phase shift $\phi_1$ with respect to the LO signal 101. The second correction signal 112 is received by the second DTC 130 together with the LO signal 101 provided by the LO 102. The second DTC 130 is controlled by the second correction signal 112 in order to output the second replica of the LO signal 131 having the second phase shift $\phi_2$ with respect to the LO signal 101. The first and second replicas of the LO signal 121, 131 are received by the first and second mixers 140, 150, respectively, in order to provide phase imbalance and amplitude imbalance reduced/compensated I and Q signals 141, 151.

The first signal processing path 210 further comprises a first ADC 230, which receives the I signal 141 and generates a digital representation of the I signal 142. Similarly, the second signal processing path 220 further comprises a second ADC 240, which receives the Q signal 151 and generates a digital representation of the Q signal 152. Both, the digital representation of the I signal 142 and the digital representation of the Q signal 152 are then provided to the digital processing module 260 of the receiver 200 for further signal processing (e.g. filtering, baseband processing). The first and second signal processing paths 210, 220 may optionally comprise further elements (e.g. one or more filters).

As indicated by lines 160 and 170, the imbalance estimation module 110 may in some examples be connected to the digital signal processing module 260. This may allow to provide the digital representation of the I signal 142 and the digital representation of the Q signal 152 to the imbalance estimation module 110. Accordingly, the imbalance estimation module 110 may calculate information related to the amplitude imbalance or information related to the phase imbalance based on the digital representation of the I signal 142 and the digital representation of the Q signal 152. In other words, a feedback loop to the imbalance estimation module 110 may be provided, in order to enable the imbalance estimation module 110 to digitally calculate the required first and second phase shifts $\phi_1$ and $\phi_2$ for reducing the imbalances.

Figure 3:
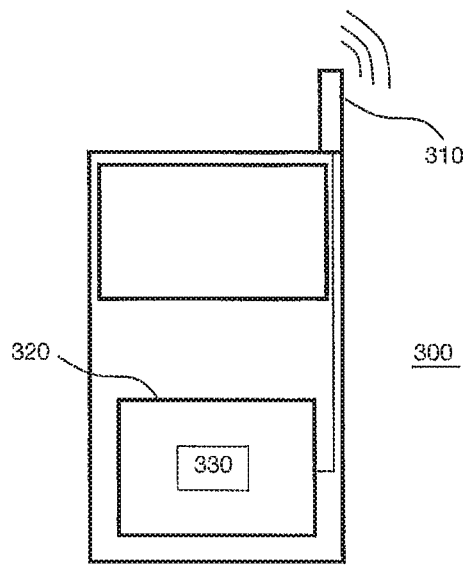
FIG. 3 illustrates an example of a mobile communications device comprising an apparatus for reducing an amplitude imbalance and a phase imbalance between an I signal and a Q signal.

An example of an implementation using an apparatus for reducing an amplitude imbalance and a phase imbalance between an I signal and a Q signal according to one or more aspects of the proposed concept or one or more examples described above is illustrated in FIG. 3. FIG. 3 schematically illustrates an example of a mobile communications device or mobile phone or user equipment 300 comprising an apparatus 330 according to an example described herein. The apparatus 330 may be comprised by a receiver 320 (e.g. according to the example described herein). An antenna element 310 of the mobile communications device 300 may be coupled to the receiver 320. To this end, mobile communications devices may be provided with improved signal reception characteristics.

Figure 4:
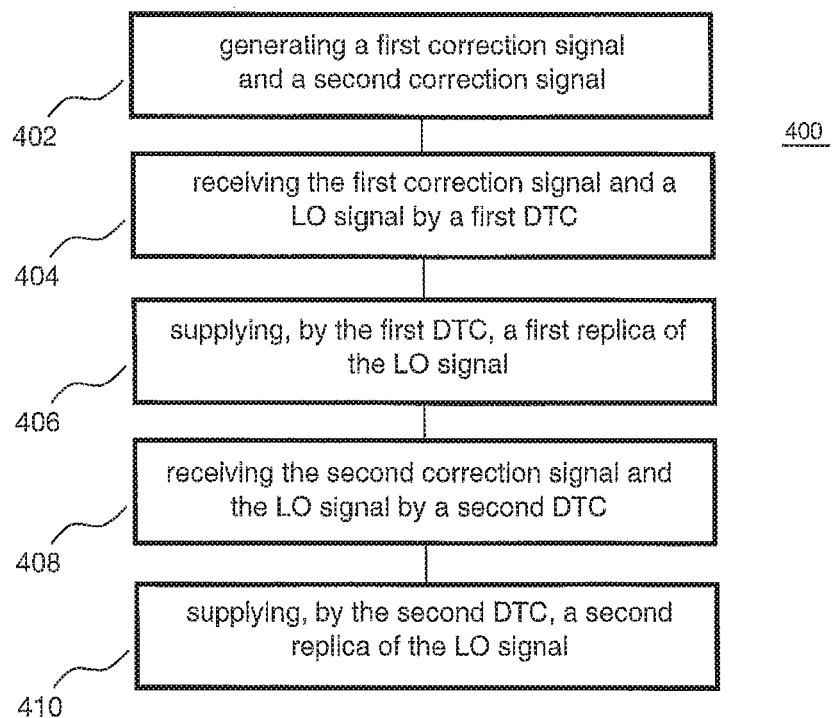
FIG. 4 illustrates a flowchart of an example of a method for reducing an amplitude imbalance and a phase imbalance between an I signal and a Q signal.

An example of a method 400 for reducing an amplitude imbalance and a phase imbalance between an I signal and a Q signal is illustrated by means of a flowchart in FIG. 4.

The I signal and the Q signal are based on a RF receive signal. The method 400 comprises generating 402 a first correction signal related to a first phase shift and a second correction signal related to a second phase shift. Further, the method 400 comprises receiving 404 the first correction signal and a LO signal by a first DTC, and supplying 406, by the first DTC, a first replica of the LO signal for a first mixer generating the I signal, wherein the first replica of the LO signal has the first phase shift with respect to the LO signal. The method 400 further comprises receiving 408 the second correction signal and the LO signal by a second DTC, and supplying 410, by the second DTC, a second replica of the LO signal for a second mixer generating the Q signal, wherein the second replica of the LO signal has the second phase shift with respect to the LO signal.

More details and aspects of the method are mentioned in connection with the proposed concept or one or more examples described above (e.g. FIGS. 1-3). The method may comprise one or more additional optional features corresponding to one or more aspects of the proposed concept or one or more examples described above.

The examples as described herein may be summarized as follows:

Example 1 is an apparatus for reducing an amplitude imbalance and a phase imbalance between an in-phase signal and a quadrature signal, the in-phase signal and the quadrature signal being based on a radio frequency receive signal, comprising: an imbalance estimation module configured to generate a first correction signal related to a first phase shift, and to generate a second correction signal related to a second phase shift; a first digital-to-time converter configured to receive the first correction signal and a local oscillator signal, and to supply a first replica of the local oscillator signal for a first mixer generating the in-phase signal, the first replica of the local oscillator signal having the first phase shift with respect to the local oscillator signal; and a second digital-to-time converter configured to receive the second correction signal and the local oscillator signal, and to supply a second replica of the local oscillator signal for a second mixer generating the quadrature signal, the second replica of the local oscillator signal having the second phase shift with respect to the local oscillator signal.

In example 2, the apparatus of example 1 further comprises a first signal processing path, the first signal processing path comprising the first mixer, and a second signal processing path, the second signal processing path comprising the second mixer.

In example 3, the first signal processing path in the apparatus of example 2 further comprises a first analog-to-digital converter configured to receive the in-phase signal and to generate a digital representation of the in-phase signal, wherein the second signal processing path further comprises a second analog-to-digital converter configured to receive the quadrature signal and to generate a digital representation of the quadrature signal.

In example 4, the imbalance estimation module of the apparatus of any of examples 1 to 3 is configured to calculate the first phase shift based on at least one of information related to the amplitude imbalance and information related to the phase imbalance.

In example 5, the imbalance estimation module of the apparatus of example 4 is configured to calculate the first phase shift according to an operation which is mathematically correspondent to $$\Phi_1 = \frac{1-k}{2},$$

with $\phi_1$ denoting the first phase shift, and k denoting an estimation of the amplitude imbalance.

In example 6, the imbalance estimation module of the apparatus of example 4 is configured to calculate the first phase shift according to an operation which is mathematically correspondent to $$\Phi_1 = \frac{k-1}{2k},$$

with $\phi_1$ denoting the first phase shift, and k denoting an estimation of the amplitude imbalance.

In example 7, the imbalance estimation module the apparatus of any of the preceding examples is configured to calculate the second phase shift based on at least one of information related to the amplitude imbalance and information related to the phase imbalance.

In example 8, the imbalance estimation module of the apparatus of example 7 is configured to calculate the second phase shift according to an operation which is mathematically correspondent to $$\Phi_2 = \frac{I}{Q}\frac{1-k}{2k} - \Phi_e,$$

with $\phi_2$ denoting the second phase shift, $\phi_e$ denoting an estimation of the phase imbalance, k denoting an estimation of the amplitude imbalance, I denoting the in-phase signal, and Q denoting the quadrature signal.

In example 9, the imbalance estimation module of the apparatus of example 7 is configured to calculate the second phase shift according to an operation which is mathematically correspondent to $$\Phi_2 = \frac{I}{Q}\frac{k-1}{2} - \Phi_e,$$

with $\phi_2$ denoting the second phase shift, $\phi_e$ denoting an estimation of the phase imbalance, k denoting an estimation of the amplitude imbalance, I denoting the in-phase signal, and Q denoting the quadrature signal.

In example 10, the imbalance estimation module of the apparatus of any of examples 4 to 9 is configured to calculate the information related to the phase imbalance based on the digital representation of the in-phase signal and the digital representation of the quadrature signal.

In example 11, the imbalance estimation module of the apparatus of any of examples 4 to 10 is configured to calculate the information related to the amplitude imbalance based on the digital representation of the in-phase signal and the digital representation of the quadrature signal.

Example 12 is a receiver comprising an apparatus for reducing an amplitude imbalance and a phase imbalance between an in-phase signal and a quadrature signal according to any of examples 1 to 11.

Example 13 is a mobile communications device comprising a receiver according to example 12.

In example 14, the mobile communications device of example 13 further comprises at least one antenna coupled to the receiver.

Example 15 is a means for reducing an amplitude imbalance and a phase imbalance between an in-phase signal and a quadrature signal, the in-phase signal and the quadrature signal being based on a radio frequency receive signal, comprising: a means for generating a first correction signal related to a first phase shift, and for generating a second correction signal related to a second phase shift; a means for receiving the first correction signal and a local oscillator signal, and for supplying a first replica of the local oscillator signal for a first mixer generating the in-phase signal, the first replica of the local oscillator signal having the first phase shift with respect to the local oscillator signal; and a means for receiving the second correction signal and the local oscillator signal, and for supplying a second replica of the local oscillator signal for a second mixer generating the quadrature signal, the second replica of the local oscillator signal having the second phase shift with respect to the local oscillator signal.

In example 16, the means for generating the first correction signal of the means of example 15 is configured to calculate the first phase shift based on at least one of information related to the amplitude imbalance and information related to the phase imbalance.

Example 17 is a method for reducing an amplitude imbalance and a phase imbalance between an in-phase signal and a quadrature signal, the in-phase signal and the quadrature signal being based on a radio frequency receive signal, comprising: generating a first correction signal related to a first phase shift and a second correction signal related to a second phase shift; receiving the first correction signal and a local oscillator signal by a first digital-to-time converter; supplying, by the first digital-to-time converter, a first replica of the local oscillator signal for a first mixer generating the in-phase signal, the first replica of the local oscillator signal having the first phase shift with respect to the local oscillator signal; receiving the second correction signal and the local oscillator signal by a second digital-to-time converter; and supplying, by the second digital-to-time converter, a second replica of the local oscillator signal for a second mixer generating the quadrature signal, the second replica of the local oscillator signal having the second phase shift with respect to the local oscillator signal.

In example 18, the method of example 17 further comprises: receiving the in-phase signal by a first analog-to-digital converter; generating a digital representation of the in-phase signal by the first analog-to-digital converter; receiving the quadrature signal by a second analog-to-digital converter; and generating a digital representation of the quadrature signal by the second analog-to-digital converter.

In example 19, the method of example 17 or example 18 further comprises calculating the first phase shift based on at least one of information related to the amplitude imbalance and information related to the phase imbalance.

In example 20, calculating the first phase shift in the method of example 19 comprises calculating the first phase shift according to an operation which is mathematically correspondent to $$\phi_1 = \frac{1-k}{2},$$

with $\phi_1$ denoting the first phase shift, and k denoting an estimation of the amplitude imbalance.

In example 21, calculating the first phase shift in the method of example 19 comprises calculating the first phase shift according to an operation which is mathematically correspondent to $$\phi_1 = \frac{k-1}{2k},$$

with $\phi_1$ denoting the first phase shift, and k denoting an estimation of the amplitude imbalance.

In example 22, the method of any of the preceding examples further comprises calculating the second phase shift based on at least one of information related to the amplitude imbalance and information related to the phase imbalance.

In example 23, calculating the second phase shift in the method of example 22 comprises calculating the second phase shift according to an operation which is mathematically correspondent to $$\phi_2 = \frac{I}{Q}\frac{1-k}{2k} - \phi_e,$$

with $\phi_2$ denoting the second phase shift, $\phi_e$ denoting an estimation of the phase imbalance, k denoting an estimation of the amplitude imbalance, I denoting the in-phase signal, and Q denoting the quadrature signal.

In example 24, calculating the second phase shift in the method of example 22 comprises calculating the second phase shift according to an operation which is mathematically correspondent to $$\phi_2 = \frac{I}{Q}\frac{k-1}{2} - \phi_e,$$

with $\phi_2$ denoting the second phase shift, $\phi_e$ denoting an estimation of the phase imbalance, k denoting an estimation of the amplitude imbalance, I denoting the in-phase signal, and Q denoting the quadrature signal.

In example 25, calculating the information related to the phase imbalance in the method of any of examples 19 to 24 is based on the digital representation of the in-phase signal and the digital representation of the quadrature signal.

In example 26, calculating the information related to the amplitude imbalance in the method of any of examples 19 to 25 is based on the digital representation of the in-phase signal and the digital representation of the quadrature signal.

Example 27 is a computer readable storage medium having stored thereon a program having a program code for performing the method of any of examples 17 to 26, when the program is executed on a computer or processor.

Example 28 is a computer program having a program code configured to perform the method of any of examples 17 to 26, when the computer program is executed on a computer or processor.

The aspects and features mentioned and described together with one or more of the previously detailed examples and figures, may as well be combined with one or more of the other examples in order to replace a like feature of the other example or in order to additionally introduce the feature to the other example.

Examples may further be a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for reducing an amplitude imbalance and a phase imbalance between an in-phase signal and a quadrature signal, the in-phase signal and the quadrature signal being based on a radio frequency receive signal, comprising:
   an imbalance estimation circuit configured to generate a first correction signal related to a first phase shift, and to generate a second correction signal related to a second phase shift, wherein the first and second correction signals are generated based on the in-phase signal and the quadrature signal;
   a first digital-to-time converter configured to receive the first correction signal and a local oscillator signal, and to supply a first replica of the local oscillator signal for a first mixer generating the in-phase signal, the first replica of the local oscillator signal having the first phase shift with respect to the local oscillator signal; and
   a second digital-to-time converter configured to receive the second correction signal and the local oscillator signal, and to supply a second replica of the local oscillator signal for a second mixer generating the quadrature signal, the second replica of the local oscillator signal having the second phase shift with respect to the local oscillator signal,
   wherein the imbalance estimation circuit is configured to calculate the first phase shift based on at least one of information related to the amplitude imbalance and information related to the phase imbalance, and
   wherein the imbalance estimation circuit is configured to calculate the first phase shift according to an operation which is mathematically correspondent to $$\Phi_1 = \frac{1-k}{2},$$

with $\phi_1$ denoting the first phase shift, and k denoting an estimation of the amplitude imbalance, or
   wherein the imbalance estimation circuit is configured to calculate the first phase shift according to an operation which is mathematically correspondent to $$\Phi_1 = \frac{k-1}{2k},$$

with $\phi_1$ denoting the first phase shift, and k denoting an estimation of the amplitude imbalance.

2. The apparatus of claim 1, further comprising:
a first signal processing path, the first signal processing path comprising the first mixer; and
a second signal processing path, the second signal processing path comprising the second mixer.

3. The apparatus of claim 1, wherein the imbalance estimation circuit is configured to calculate the second phase shift based on at least one of information related to the amplitude imbalance and information related to the phase imbalance.

4. The apparatus of claim 1, wherein the imbalance estimation circuit is configured to calculate the information related to the phase imbalance based on the digital representation of the in-phase signal and the digital representation of the quadrature signal.

5. The apparatus of claim 1, wherein the imbalance estimation circuit is configured to calculate the information related to the amplitude imbalance based on the digital representation of the in-phase signal and the digital representation of the quadrature signal.

6. A receiver comprising an apparatus for reducing an amplitude imbalance and a phase imbalance between an in-phase signal and a quadrature signal according to claim 1.

7. The apparatus of claim 2, wherein the first signal processing path further comprises a first analog-to-digital converter configured to receive the in-phase signal and to generate a digital representation of the in-phase signal, and wherein the second signal processing path further comprises a second analog-to-digital converter configured to receive the quadrature signal and to generate a digital representation of the quadrature signal.

8. A mobile communications device comprising a receiver according to claim 6.

9. The mobile communications device of claim 8, further comprising at least one antenna coupled to the receiver.

10. An apparatus for reducing an amplitude imbalance and a phase imbalance between an in-phase signal and a quadrature signal, the in-phase signal and the quadrature signal being based on a radio frequency receive signal, comprising:
an imbalance estimation circuit configured to generate a first correction signal related to a first phase shift, and to generate a second correction signal related to a second phase shift, wherein the first and second correction signals are generated based on the in-phase signal and the quadrature signal;
a first digital-to-time converter configured to receive the first correction signal and a local oscillator signal, and to supply a first replica of the local oscillator signal for a first mixer generating the in-phase signal, the first replica of the local oscillator signal having the first phase shift with respect to the local oscillator signal; and
a second digital-to-time converter configured to receive the second correction signal and the local oscillator signal, and to supply a second replica of the local oscillator signal for a second mixer generating the quadrature signal, the second replica of the local oscillator signal having the second phase shift with respect to the local oscillator signal,
wherein the imbalance estimation circuit is configured to calculate the second phase shift based on at least one of information related to the amplitude imbalance and information related to the phase imbalance, and
wherein the imbalance estimation circuit is configured to calculate the second phase shift according to an operation which is mathematically correspondent to $$\phi_2 = \frac{I}{Q}\frac{1-k}{2k} - \phi_e,$$

with $\phi_2$ denoting the second phase shift, $\phi_e$ denoting an estimation of the phase imbalance, k denoting an estimation of the amplitude imbalance, I denoting the in-phase signal, and Q denoting the quadrature signal, or
wherein the imbalance estimation circuit is configured to calculate the second phase shift according to an operation which is mathematically correspondent to $$\phi_2 = \frac{I}{Q}\frac{k-1}{2} - \phi_e,$$

with $\phi_2$ denoting the second phase shift, $\phi_e$ denoting an estimation of the phase imbalance, k denoting an estimation of the amplitude imbalance, I denoting the in-phase signal, and Q denoting the quadrature signal.

11. A method for reducing an amplitude imbalance and a phase imbalance between an in-phase signal and a quadrature signal, the in-phase signal and the quadrature signal being based on a radio frequency receive signal, comprising:
generating a first correction signal related to a first phase shift and a second correction signal related to a second phase shift using an imbalance estimation circuit;
receiving the first correction signal and a local oscillator signal by a first digital-to-time converter;
supplying, by the first digital-to-time converter, a first replica of the local oscillator signal for a first mixer generating the in-phase signal, the first replica of the local oscillator signal having the first phase shift with respect to the local oscillator signal;
receiving the second correction signal and the local oscillator signal by a second digital-to-time converter; and
supplying, by the second digital-to-time converter, a second replica of the local oscillator signal for a second mixer generating the quadrature signal, the second replica of the local oscillator signal having the second phase shift with respect to the local oscillator signal,
wherein the method further comprises calculating the first phase shift based on at least one of information related to the amplitude imbalance and information related to the phase imbalance, and
wherein calculating the first phase shift comprises calculating the first phase shift according to an operation which is mathematically correspondent to $$\phi_1 = \frac{1-k}{2},$$

with $\phi_1$ denoting the first phase shift, and k denoting an estimation of the amplitude imbalance, or
wherein calculating the first phase shift comprises calculating the first phase shift according to an operation which is mathematically correspondent to $$\phi_1 = \frac{k-1}{2k},$$

with $\phi_1$ denoting the first phase shift, and k denoting an estimation of the amplitude imbalance.

12. The method of claim 11, further comprising:
receiving the in-phase signal by a first analog-to-digital converter;
generating a digital representation of the in-phase signal by the first analog-to-digital converter;
receiving the quadrature signal by a second analog-to-digital converter; and
generating a digital representation of the quadrature signal by the second analog-to-digital converter.

13. The method of claim 11, wherein calculating the information related to the phase imbalance is based on the digital representation of the in-phase signal and the digital representation of the quadrature signal.

14. The method of claim 11, wherein calculating the information related to the amplitude imbalance is based on the digital representation of the in-phase signal and the digital representation of the quadrature signal.

15. A method for reducing an amplitude imbalance and a phase imbalance between an in-phase signal and a quadrature signal, the in-phase signal and the quadrature signal being based on a radio frequency receive signal, comprising:
- generating a first correction signal related to a first phase shift and a second correction signal related to a second phase shift using an imbalance estimation circuit;
- receiving the first correction signal and a local oscillator signal by a first digital-to-time converter;
- supplying, by the first digital-to-time converter, a first replica of the local oscillator signal for a first mixer generating the in-phase signal, the first replica of the local oscillator signal having the first phase shift with respect to the local oscillator signal;
- receiving the second correction signal and the local oscillator signal by a second digital-to-time converter; and
- supplying, by the second digital-to-time converter, a second replica of the local oscillator signal for a second mixer generating the quadrature signal, the second replica of the local oscillator signal having the second phase shift with respect to the local oscillator signal,
- wherein the method further comprises calculating the second phase shift based on at least one of information related to the amplitude imbalance and information related to the phase imbalance, and
  - wherein calculating the second phase shift comprises calculating the second phase shift according to an operation which is mathematically correspondent to $$\phi_2 = \frac{I}{Q}\frac{1-k}{2k} - \phi_e,$$

with $\phi_2$ denoting the second phase shift, $\phi_e$ denoting an estimation of the phase imbalance, k denoting an estimation of the amplitude imbalance, I denoting the in-phase signal, and Q denoting the quadrature signal, and wherein calculating the second phase shift comprises calculating the second phase shift according to an operation which is mathematically correspondent to $$\phi_2 = \frac{I}{Q}\frac{k-1}{2} - \phi_e,$$

with $\phi_2$ denoting the second phase shift, $\phi_e$ denoting an estimation of the phase imbalance, k denoting an estimation of the amplitude imbalance, I denoting the in-phase signal, and Q denoting the quadrature signal.

* * * * *